United States Patent
Bendall (10) Patent No.: US 11,733,825 B2
(45) Date of Patent: Aug. 22, 2023

(54) INTERACTIVE THREE-DIMENSIONAL REPRESENTATIONS OF OBJECTS

(71) Applicant: Baker Hughes Holdings LLC, Houston, TX (US)

(72) Inventor: Clark Alexander Bendall, Syracuse, NY (US)

(73) Assignee: Baker Hughes Holdings LLC, Houston, TX (US)

( * ) Notice: Subject to any disclaimer, the term of this patent is extended or adjusted under 35 U.S.C. 154(b) by 49 days.

(21) Appl. No.: 17/132,599

(22) Filed: Dec. 23, 2020

(65) Prior Publication Data
US 2021/0208765 A1     Jul. 8, 2021

Related U.S. Application Data

(60) Provisional application No. 62/956,465, filed on Jan. 2, 2020.

(51) Int. Cl.
| | |
|---|---|
| *G06F 3/04815* | (2022.01) |
| *G06T 15/10* | (2011.01) |
| *G06F 3/04842* | (2022.01) |

(52) U.S. Cl.
CPC ...... *G06F 3/04815* (2013.01); *G06F 3/04842* (2013.01); *G06T 15/10* (2013.01); *G06T 2200/24* (2013.01)

(58) Field of Classification Search
CPC .................................................. G06F 3/04815
See application file for complete search history.

(56) References Cited

U.S. PATENT DOCUMENTS

| | | | |
|---|---|---|---|
| 2007/0109296 A1* | 5/2007 | Sakagawa | ............... G06T 19/00 |
| | | | 345/419 |
| 2008/0307327 A1* | 12/2008 | Newcomer | ............. G06T 19/20 |
| | | | 715/757 |

(Continued)

FOREIGN PATENT DOCUMENTS

| | | | |
|---|---|---|---|
| KR | 10-2019-0098201 A | 8/2019 | |
| WO | 2011-053328 A1 | 5/2011 | |
| WO | WO-2011053328 A1 * | 5/2011 | ............. G06T 11/00 |

OTHER PUBLICATIONS

International Search Report and Written Opinion issued in corresponding International Application No. PCT/US2020/067257, dated Dec. 29, 2020, 8 pages.

*Primary Examiner* — Roland J Casillas
(74) *Attorney, Agent, or Firm* — Mintz Levin Cohn Ferris Glovsky and Popeo, PC (57) ABSTRACT

A method includes receiving data characterizing a target surface extending in three dimensions. The method also includes rendering in a graphical user interface display space, a first visual representation including a two-dimensional image of a first portion of the target surface, and a second visual representation including a three-dimensional representation of at least a subset of the first portion of the target surface included in the first visual representation. The method further includes receiving, based on a first user interaction with the three-dimensional representation via a cursor configured to move over the three-dimensional representation, a first user input indicative of selection of a first location of the target surface. The method also includes rendering a first graphical object at a first target position in the three-dimensional representation and a second graphical object at a second target position in the two-dimensional image. The first and the second target positions are indicative of the first location of the target surface.

17 Claims, 9 Drawing Sheets

(56) References Cited

U.S. PATENT DOCUMENTS

| | | | |
|---|---|---|---|
| 2012/0099804 A1 | 4/2012 | Aguilera et al. | |
| 2014/0281961 A1* | 9/2014 | Baker | G16H 30/40 715/705 |
| 2015/0331970 A1 | 11/2015 | Jovanovic | |

* cited by examiner

INTERACTIVE THREE-DIMENSIONAL REPRESENTATIONS OF OBJECTS

RELATED APPLICATION

This application claims priority under 35 U.S.C. § 119(e) to U.S. Provisional Patent Application No. 62/956,465 filed on Jan. 2, 2020, the entire content of which is hereby expressly incorporated by reference herein.

BACKGROUND

Three-dimensional objects (e.g., surfaces) can be imaged and presented in a graphical user interface (GUI). For example, a two-dimensional image (e.g., a picture) of the object can be presented in the GUI. Alternately, a three-dimensional image (e.g., a point cloud view) of the object can be presented in the GUI. A point cloud view can be generated by detecting multiple locations on the external surface of the object using a 3D image technique such as structured light projection, stereo, photogrammetry, time of flight, etc. In some implementations, multiple images of the external object can be combined to generate a portion of the three-dimensional image. Point clouds can be used to generate 3D computer-aided design (CAD) models of manufactured parts, for metrology, in animation, etc.

SUMMARY

Various aspects of the disclosed subject matter may provide one or more of the following capabilities.

A method includes receiving data characterizing a target surface extending in three dimensions. The method also includes rendering in a graphical user interface display space, a first visual representation including a two-dimensional image of a first portion of the target surface, and a second visual representation including a three-dimensional representation of at least a subset of the first portion of the target surface included in the first visual representation. The method further includes receiving, based on a first user interaction with the three-dimensional representation, a first user input indicative of selection of a first location of the target surface. The method also includes rendering a first graphical object at a first target position in the three-dimensional representation and a second graphical object at a second target position in the two-dimensional image. The first and the second target positions are indicative of the first location of the target surface.

One or more of the following features can be included in any feasible combination.

In one implementation, the method further includes receiving, based on a second user interaction with the three-dimensional representation, a second user input indicative of selection of two locations of the target surface. The method also includes rendering, in the graphical user interface, a numerical value (measurement result), which may be one or more of a value indicative of distance between the two locations.

In one implementation, the second user interaction includes selecting a first position on the three-dimensional representation (e.g., via a mouse, via a touchscreen, etc.); and selecting a second position on the three-dimensional representation (e.g., via a mouse, via a touchscreen, etc.), wherein the first and the second positions are indicative of the two locations. In another implementation, the method further includes receiving, based on a third user interaction with the three-dimensional representation, a third user input indicative of selection of three locations of the target surface (e.g., a first location, a second location and a third location). The method also includes indicating portions of the target surface rendered in the three-dimensional representation that are located on or adjacent to a reference plane that includes the three selected locations. The locations are indicated by a first set of three graphical objects (e.g., a graphical object for each location) having a predetermined color in the two-dimensional image and a second set of three graphical objects having the predetermined color in the three-dimensional representation.

In one implementation, the method further includes rendering, in the three-dimensional representation, a third graphical object indicative of the reference plane; and rendering, in the three-dimensional representation, a fourth graphical object indicative of distance between a target position on the three-dimensional representation and the reference plane. In another implementation, the method includes receiving, based on a fourth user interaction with the first graphical object, a fourth user input indicative of movement of the first graphical object along a first path in the three-dimensional representation. The method also includes rendering, in the two-dimensional image, movement of the second graphical object along a second path, wherein the second path is determined by identifying pixel coordinates in the two-dimensional image that are associated with 3D surface point traversed along the first path.

Non-transitory computer program products (i.e., physically embodied computer program products) are also described that store instructions, which when executed by one or more data processors of one or more computing systems, causes at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including a connection over a network (e.g. the Internet, a wireless wide area network, a local area network, a wide area network, a wired network, or the like), via a direct connection between one or more of the multiple computing systems, etc.

These and other capabilities of the disclosed subject matter will be more fully understood after a review of the following figures, detailed description, and claims.

BRIEF DESCRIPTION OF THE FIGURES

These and other features will be more readily understood from the following detailed description taken in conjunction with the accompanying drawings, in which.

DETAILED DESCRIPTION

A three-dimensional object (e.g., a surface) can be imaged and the imaged data can be presented to a user for inspection in a graphical user interface (GUI) of an inspection system. The imaged data can be presented as a two-dimensional (2D) image and/or a three-dimensional (3D) image. For example, a structured light system including a camera, a white light illuminator, and a structured light pattern projector may be used. The camera may capture a 2D white-light image of a target surface with the white light illuminator enabled. The camera may also capture 2D images of structured light patterns projected onto the target surface, which can then be used to calculate a 3D (x,y,z) coordinate associated with each pixel in the 2D white-light image. The inspection system can present the 2D white light image in the GUI. These 2D and/or 3D images can be interactive and can allow the user to inspect the surface (e.g., measure distance between locations on the surface, view the surface from various viewpoints, etc.). In some implementations, both a 2D image and a 3D image of the surface can be simultaneously presented in the GUI. The 3D image can be a three-dimensional representation of the portion of the surface displayed in the 2D image A user can interact with the 2D image (e.g., move a cursor over the 2D image [via a mouse, via a touch screen, etc.], select portions of the 2D image, zoom into portions of the 2D image, etc.) and a corresponding interaction can be generated in the 3D representation. For example, a user can move a cursor along a path over the 2D image and the inspection system can generate a graphical object (e.g., another cursor) that can move along a path in the 3D representation. Alternately, the user can select a path in the 2D image via interaction with a touch screen that can result in generation of a graphical object (e.g., another cursor) that can move along a path in the 3D representation. This path can be determined by identifying pixel coordinates in the 3D representation that are associated with the path traversed in the 2D image.

It may be desirable for the user to interact directly with the 3D representation (also referred to as 3D point cloud view) rather than indirectly via the 2D image. For example, the user may want to select a location on the imaged surface (e.g., for a measurement) and the 3D representation may provide the user with increased visibility of surface contours and/or improved spatial precision in selecting the location compared to the 2D image. While the user may vary the position of the cursor on the 2D image (which corresponds to traversing over the imaged surface) by looking at the corresponding movement of a graphical object in the 3D representation, this process can be cumbersome and inefficient. This application provides for an improved inspection system that allows the user to interact directly with the 3D representation and generate the corresponding interaction in the 2D image (e.g., interact directly via a mouse, interact via a touch screen, etc.).

Figure 1:
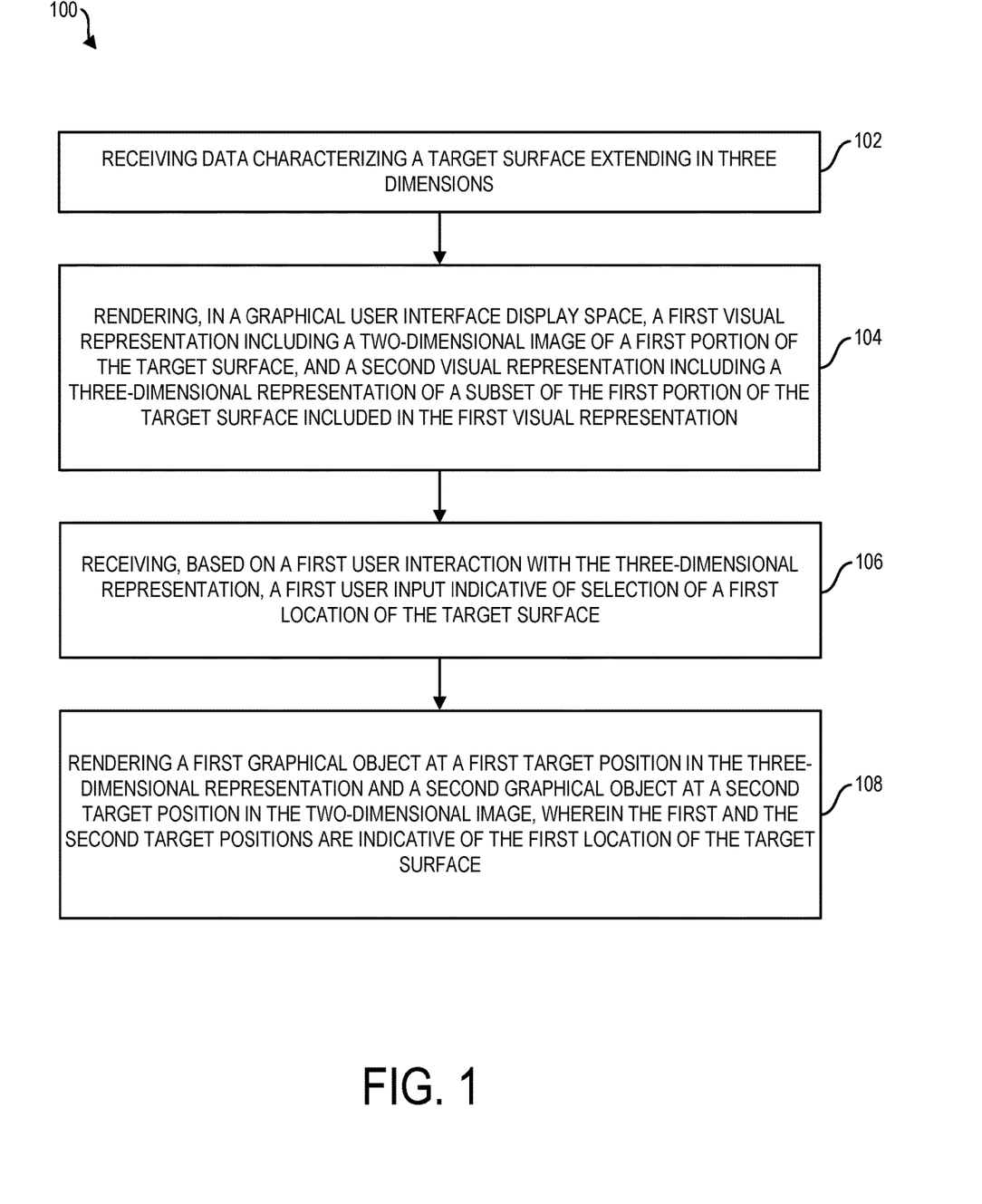
FIG. 1 is a flow chart of an exemplary method of presenting in interactive graphical user interface with a two-dimensional image and a three-dimensional representation of the two-dimensional image.

FIG. 1 is a flow chart of an exemplary method of presenting an interactive graphical user interface with a two-dimensional image of a target surface and a three-dimensional representation of the target surface shown in the two-dimensional image. At 102, data characterizing a target surface extending in three dimensions can be received (e.g., by a computing device in the inspection system). This data can be generated by imaging the target surface (e.g., a weld joining two surfaces), and can include three-dimensional information of the target surface (e.g., contours of the target surface). Data characterizing the target surface can be stored in a storage device (e.g., remotely stored in a server) and can be transferred to the computing device.

Figure 2:
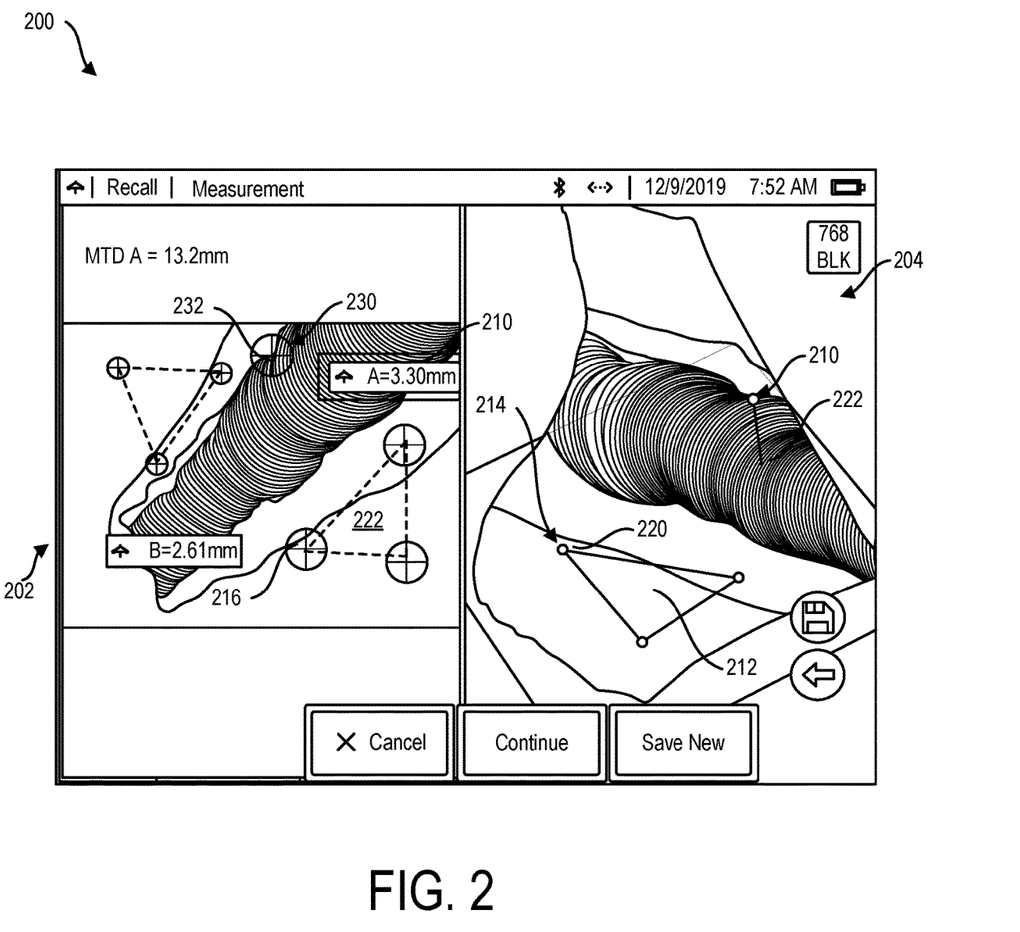
FIG. 2 illustrates an exemplary graphical user interface (GUI) including a two-dimensional image of a portion of the target surface and a three-dimensional representation of the portion of the target surface shown in the two-dimensional image.

Returning to FIG. 1, at 104, a first visual representation including a two-dimensional image of at least a first portion of the target surface, and a second visual representation including a three-dimensional representation of the first portion of the target surface shown in the two-dimensional image included in the first visual representation can be rendered in a GUI. FIG. 2 illustrates an exemplary GUI 200 with the first visual representation 202 that includes a 2D image of a portion of the target surface. The GUI 200 also includes the second visual representation 204 that includes a three-dimensional representation of the portion of the target surface shown in the two-dimensional image in the first visual representation 202. The first/second visual representations 202/204 can include graphical objects that can indicate selection of locations (e.g., graphical object 210), lines connecting graphical objects, measurement values (e.g., measurement value 208), and the like.

In some implementations, graphical objects such as cursors, may be used to select locations on a viewed surface in order to determine a geometric dimension of a feature on the viewed surface. For example, to measure the height of a weld connecting two metal plates, a point-to-plane measurement may be used wherein three reference-plane cursors can be placed to select three reference-plane locations on one plate, and a fourth offset cursor can be placed to select one offset location on the far edge of the weld. 3D coordinates associated with the reference-plane locations can be used to determine a reference plane, and the distance from the plane to a 3D coordinate associated with the offset location along a direction normal to the reference plane can be computed and displayed as a measurement result. Lines may also be added connecting the three reference-plane cursors to differentiate them from the offset cursor. Lines may also be added to represent the projection from the offset location back to the reference plane. Other types of measurements, such as length, area, point-to-line distance, etc. may also be performed using differing numbers of cursors and including different types of graphical objects to indicate different relationships or associated functions.

In some implementations, no 3D coordinates are considered when rendering graphical objects on top of the 2D image or 3D representation such that in the displayed GUI, pixels of the 2D image or 3D representation are partially or fully obscured by the graphical object without determining any 3D relationships. In another embodiment, the graphical object is defined in 3D space, and its relationship to the viewed target surface and other graphical objects in 3D space affects how it appears in the GUI. For example, sphere 214 displayed as part of 3D representation 204 may have an assigned center 3D coordinate and a defined radius. If the target surface is rendered from a viewpoint from which a first portion of sphere 214 is closer to the viewpoint than any portion of the target surface and a second portion of sphere 214 is further from the viewpoint than a portion of the target surface, the second portion may be partially or fully occluded by the surface and the first portion may partially or fully occlude some portion of the target surface. Thus sphere 214 appears to have a non-zero volume and appears to be part of the 3D scene rather than simply being a 2D graphical object rendered on top of 3D representation 204.

In some implementations, graphical objects shown in 3D representation 204 are defined by one or more triangles that are rendered by a Graphics Processing Unit (GPU). For example, multiple triangles can be used to form the shape of a graphical object or portions thereof (e.g. sphere, toroid, etc.). The graphical objects can be oriented relative to a reference plane (e.g., a reference plane chosen by the user). For example, the graphical object can be oriented relative to a normal vector associated with the reference plane.

In some implementations, the inspection system can calculate 3D coordinates and render the 3D representation in the GUI based on the calculated 3D coordinates. For example, the computed 3D coordinates can be used to define the vertices of 3D triangles, which can then be processed using a Graphics Processing Unit (GPU) to render the 3D image from the perspective of a virtual camera whose position relative to the target surface can be freely assigned. In some implementations, the 3D coordinates can be associated with a pixel of the 2D image and can be indicative of the position of a point on the target surface associated with the 2D pixel. The inspection system can generate a set of 3D surface points in the 3D representation where each 3D surface point includes one of the plurality of 3D coordinates and a color based on the color of the associated 2D image pixel.

In some implementations, the graphical objects can be interactive (e.g., a user can click on a graphical object, drag the graphical object over the 2D/3D image, etc.) For a given graphical object in first/second visual representation (e.g., sphere 214 in the 3D representation), the inspection system can generate a corresponding graphical object in the adjacent visual representation. For example, the inspection system can generate the graphical object 216 in the 2D image which corresponds to the graphical object 214 in the 3D representation. Additionally, graphical objects 214 and 216 can be identified (e.g., using a circle, sphere, etc.)

Figure 3:
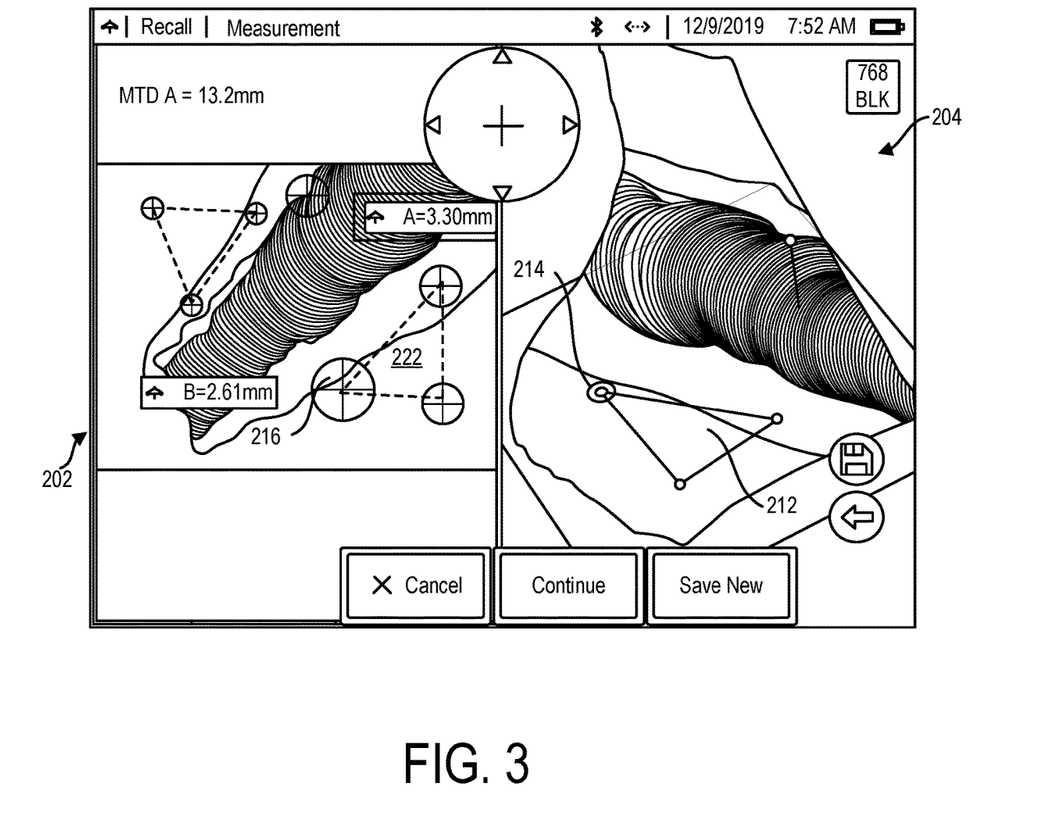
FIG. 3 illustrates an exemplary embodiment of the GUI in FIG. 2 that include graphical objects in active state.

The visual properties of the graphical objects can be indicative of the state of the graphical object (e.g., active, inactive, movable, etc.). For example, as illustrated in FIG. 2, the graphical object 208 providing the measurement result can be in an active state as indicated by a blue outline at which time the graphical object 214 can be represented by a solid sphere rendered as part of the 3D scene and graphical object 216 can be represented by a circle drawn on top of the 2D image. This can indicate that the cursors are inactive. Upon interaction with a cursor (e.g., by placing an interactive cursor on the marker 214/216), the marker can become active. FIG. 3 illustrates an exemplary embodiment of the GUI 200 with activated markers 214/216. For example, the activated marker 214 in the 3D representation can be represented by a sphere with a torus around the sphere. The corresponding marker 216 in the 2D image can be represented by a blue circle (e.g., which is larger is size compared to the inactive green circle in FIG. 2).

Figure 4:
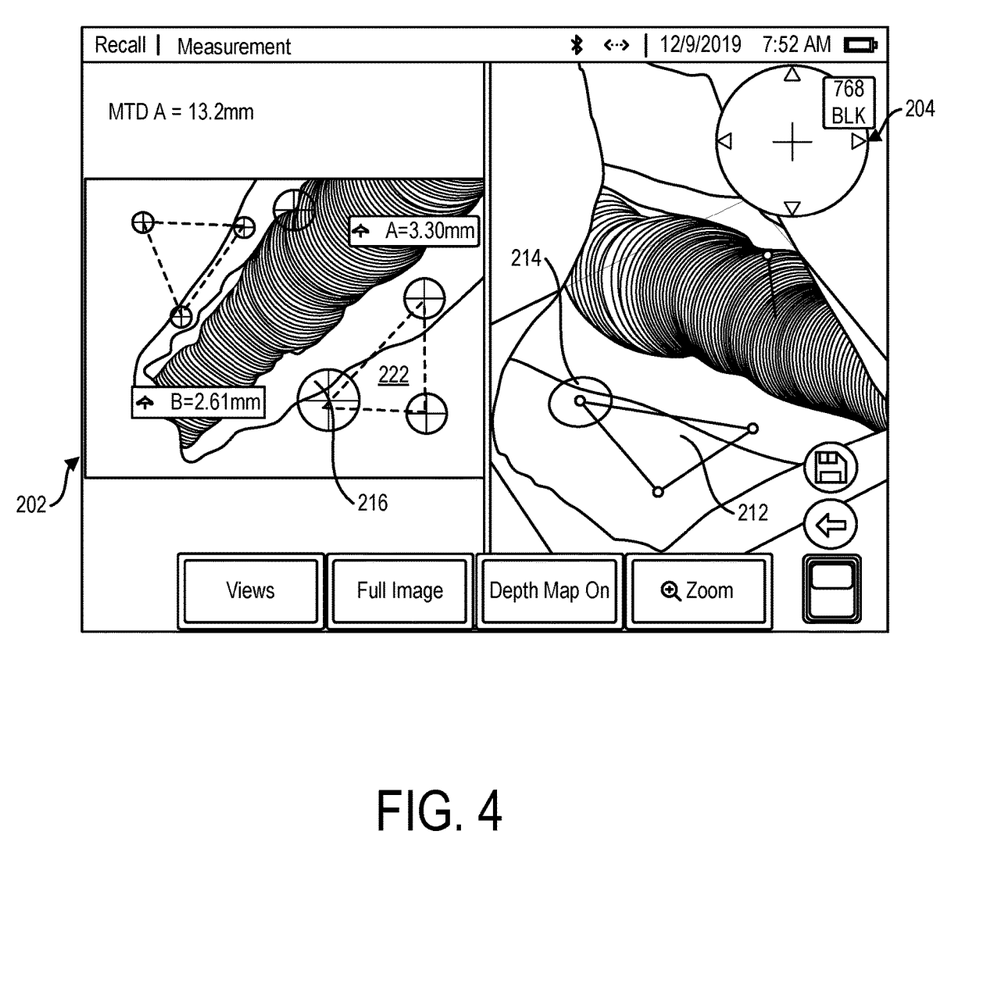
FIG. 4 illustrates an exemplary embodiment of the GUI in FIG. 2 that include graphical objects in movable state.

FIG. 4 illustrates another exemplary embodiment of the GUI 200 where the markers 214/216 are in a movable state. This indicates that the markers 214/216 can be moved in the 3D representation/2D image. Markers in the movable state can be presented by a visual representation different from that of the markers in inactive or active state. For example, as illustrated in FIG. 4, the marker 214 in the movable state is represented by a smaller sphere (compared to the active state) and a larger torus surrounding the sphere (compared to the active state). A graphical object (e.g., marker 214) can toggle between the different states (e.g., based on input from the user)

Returning to FIG. 1, at 106, a first user input indicative of selection of a first location of the target surface can be received ("first input mode" of the inspection system). The receiving can be based on a user interaction with the three-dimensional representation. For example, a user can move and place a cursor at the position 222 in the 3D representation and select the position 220 (e.g., by clicking, touching a touchscreen displaying GUI 200, etc.). Alternately, a user can move and place a cursor at the position 220 in the 3D representation and select the existing graphical object 214. A user interaction can include, for example, selection of multiple positions on the 3D representation (e.g., by multiple clicks of a mouse, multiple touches on a touch screen, etc.).

In some implementations, the user can indicate a desired new position or change in position of a graphical object via one or more of touch, mouse drag, joystick movement, arrow key, zoom window press, etc. Based on the new location of the graphical object, the inspection system can determine the corresponding location in the 2D image (e.g., if the selection is in the 3D representation) or in the 3D representation (e.g., if the selection is in the 2D image). For example, the new position selected by the user can be in the screen pixel coordinates (e.g., 2D pixel coordinates) of the GUI 200. Each screen pixel coordinate can be associated with a ray in the coordinate system of the 3D representation. The inspection system can compute this ray based on the selected screen pixel coordinate and the orientation of the 3D representation. The 3D representation of the target surface (or a portion thereof) can be formed using a plurality of triangles, and the computed ray can impinge the 3D representation of the target surface at one of the triangles.

Additionally or alternately, some implementations may allow a user to rotate the 3D representation for inspection from different vantage points and to adjust the location of a 3D graphical object (e.g. sphere 214) using the same user inputs when operating in different input modes. For example, in a first input mode, user inputs such as a mouse drag while holding the left mouse button depressed, a touch screen drag, the push of a joystick, or pressing a key on a keyboard may result in a change in position of a 3D graphical object that is in a movable state on the surface of the object shown in the second visual representation 204, while in a second input mode, those same user inputs may result in a rotation of the 3D representation with no change in the positions of any 3D graphical objects on the surface of the object. To transition from the first input mode (3D graphical object movement) to the second input mode (rotation), the user may click or tap at a location that is at least a minimum distance from any 3D graphical object or press a designated button, which would cause any graphical object that is in a movable state to transition to an active or inactive state. To transition from the second input mode (rotation) to the first input mode (3D graphical object movement), the user may click or tap within a maximum distance from a 3D graphical object at which time that graphical object would enter the movable state. To minimize the risk of accidental movement of a 3D graphical object, some implementations may require that a mouse button be depressed and released or a touch screen contact be made and broken in close proximity to a 3D graphical object without significant movement of the mouse or touching finger or stylus before a transition from the second input mode to the first input mode would occur. After transitioning to the first input mode, a mouse or touch drag initiated at a point near the 3D graphical object (user input at 106) may result in movement of that object without any rotation of the 3D representation. Furthermore, after entering the first input mode, some implementations may detect an offset between the starting position of a mouse or touch drag and a 3D graphical object in a movable state and maintain that offset between the mouse or touch point and the updated position of the 3D graphical object at step 108 to allow the user to maintain an unobstructed view of the 3D graphical object while it is being repositioned. Otherwise it could be obscured by the mouse cursor or the finger or stylus being used making it difficult to position accurately. Thus in some implementations, operation changes between the second input mode and the first input mode can be based at least partially on the distance between a first pixel position of a graphical object (e.g., pixel selected at step 106) on the GUI and the pixel position on the display device of a mouse or trackball cursor shown on the display device when a button on the mouse or trackball is depressed or the pixel position on the display device associated with a point on a touch sensitive panel at which contact is initiated.

At 108, a first graphical object can be rendered at a first target position in the three-dimensional representation and a second graphical object can be rendered at a second target position in the two-dimensional image. For example, based on the interaction at step 106 at the location 222, a new graphical object (e.g., graphical object 210) can be generated in the 3D representation in the second visual representation 204. Additionally, a second graphical object 230 can be generated at position 232 in the 2D image in the first visual representation 202. The position 210 in the 3D representation and the position 232 in the 2D image can be indicative of the same location on the target surface.

Figure 5A:
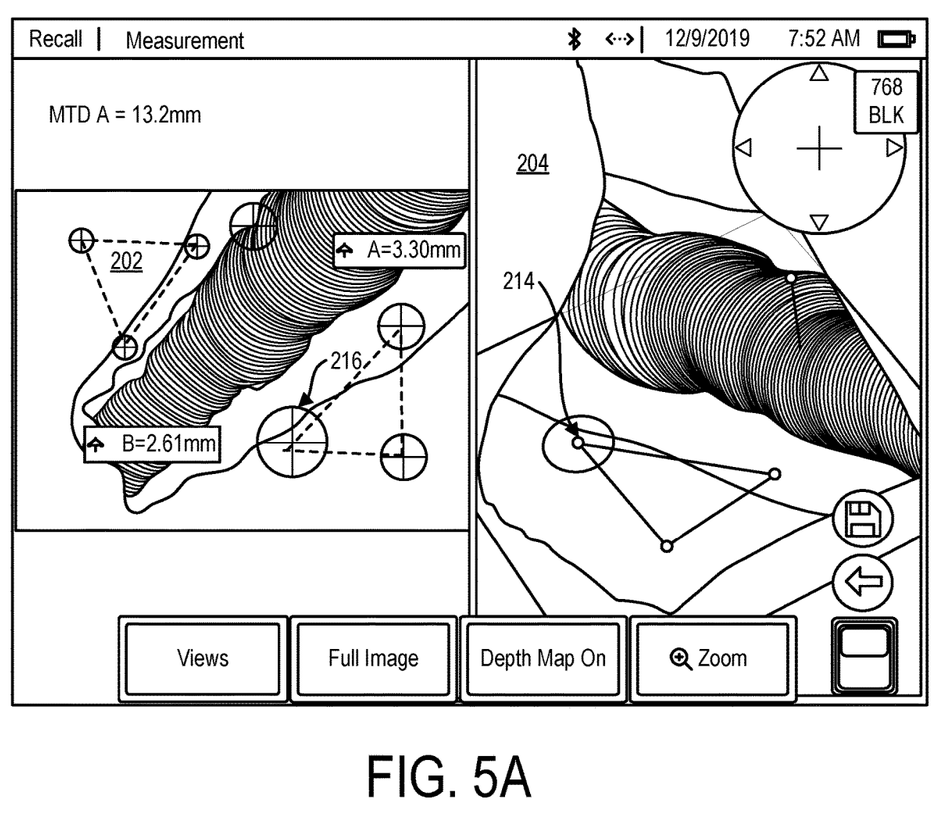
FIGS. 5A-5C illustrates an exemplary user interaction with a graphical object in the GUI of FIG. 2.
Figure 5B:
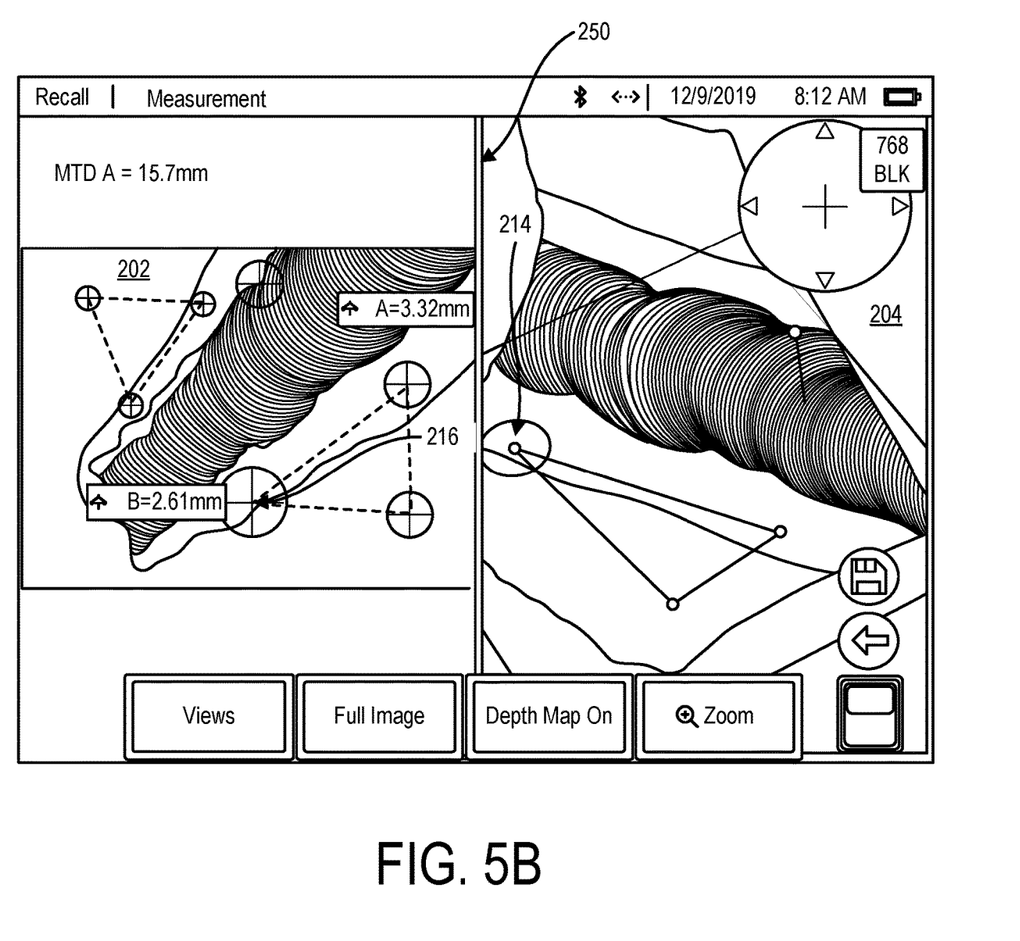
Figure 5C:
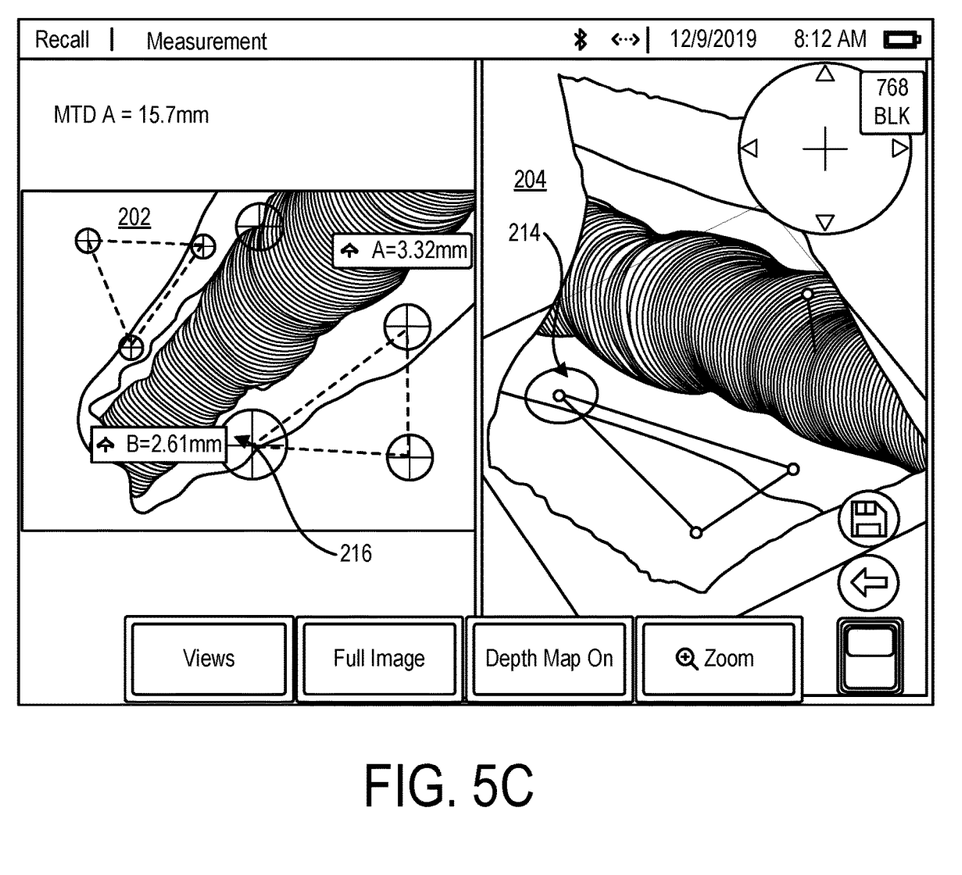

In another implementation, the interaction at step 106 can activate an existing graphical object (e.g., marker 214). Once the marker 214 is activated, it can be manipulated. For example, the marker 214 can be moved in the 3D representation of the second visual representation 204. FIGS. 5A-C illustrates an exemplary interaction with the marker 214. The inspection device can receive an input indicative of movement of the graphical object (e.g., marker 214) along a first path in the 3D representation. This input can be based on a user interaction with the marker 214 (e.g., dragging the marker 214 over the 3D representation). As illustrated in FIG. 5B, based on this user interaction with marker 214, the marker 216 in the 2D image can move along a second path. The second path can be determined by identifying pixel coordinates in the 2D image that are associated with 3D surface point traversed along the first path. In some implementations, the 3D representation may only include 3D surface points that fall within a 3D region of interest determined using the positions of the markers forming an individual measurement of a feature on the surface of the viewed object. As the position of a marker (e.g. 214) is changed in step 108, the region of interest may be changed accordingly resulting in an increase or decrease in the screen space occupied by the 3D surface in the 3D representation. Adjusting the magnification and/or position of the 3D representation during step 108 may make the marker position difficult to control as the surface may be moving underneath the mouse cursor or finger/stylus on a touch screen and thus changing the surface point that is displayed at the mouse/ touch location. In one implementation, the user would have to manually re-center and/or resize the 3D representation after moving a marker in order to maintain a desired size of the 3D representation on the display. Alternatively, the 3D representation can be automatically resized and re-centered in the second visual representation 204 resulting in more efficient operation. For example, the resizing of the 3D representation can include reducing or increasing the area (or magnification) of the 3D representation (e.g., by a predetermined ratio), and re-centering can include determining the center of the 3D representation, and placing the center of the 3D representation at a predetermined center of the second visual representation 204. The automatic resizing and/or re-centering may occur at the completion of step 108. For example, if the user input at step 106 is a mouse drag while holding a mouse button depressed, the automatic resizing/re-centering may be performed when the mouse button is released. If the user input at step 106 is movement of a finger or stylus on a touch screen, the automatic resizing/re-centering may be performed when contact with the touch screen is broken. If the user input at step 106 is the push of a joystick away from its center position, the automatic resizing/re-centering may be performed when the joystick returns to a point near its center position.

In some implementations, distance between two locations on the target object can be determined based on interaction with the GUI 200. For example, a user can interact with the 3D representation in the second visual representation 204 (e.g., via a cursor), and select two positions (e.g. by clicking on the two positions, by touching two positions on an interactive touchscreen, etc.) on the 3D representation (indicative of two locations on the surface of the target surface). This can be done, for example, by setting the GUI 200 to operate in a measurement mode (e.g., by selecting the measurement mode from a task bar of the GUI). After the two locations are selected on the target surface, the inspection system can calculate and present the distance between the two locations in the GUI 200. For example, the Euclidean distance been the two locations and/or distances along the various dimensions (e.g., along x-axis, y-axis, z-axis, etc.) can be calculated and presented.

Figure 6:
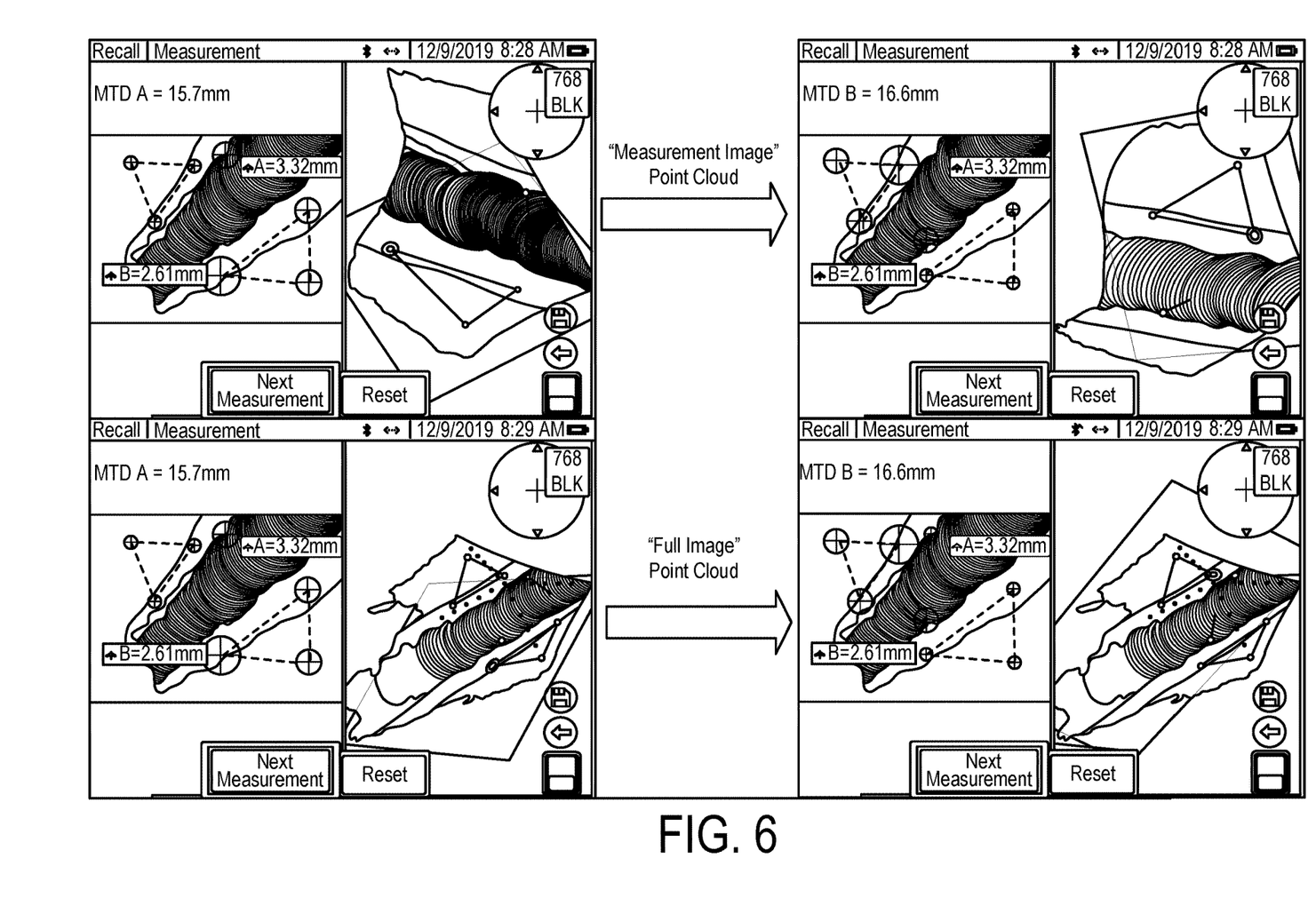
FIG. 6 illustrates exemplary toggling between the various measurements.

In some implementations, multiple measurements of the target object can be performed based on interaction with the GUI 200. A user can toggle between the various measurements (e.g., measured values, graphical objects associated with the measurement, etc.). FIG. 6 illustrates exemplary toggling between the various measurements. For example, the user can select the "Next Measurement" icon in the GUI that can allow the user to toggle between measurements. In one implementation, a method executed by the inspection system can include defining a first measurement comprising a first plurality of measurement cursors and a second measurement comprising a second plurality of measurement cursors. Each measurement cursor can be associated with a pixel location in the 2D image. The method can further include determining a first 3D region of interest based on the locations of the first plurality of measurement cursors (or markers), and determining a second 3D region of interest based on the locations of the second plurality of measurement cursors (or markers). The first 3D graphical object can be one of a first plurality of 3D graphical objects associated with the first plurality of measurement cursors and a second plurality of 3D graphical objects can be associated with the second plurality of measurement cursors. The first 3D image can include the first plurality of 3D graphical objects and not the second plurality of 3D graphical objects, the first representation of the surface of the object that excludes the 3D surface points that are outside the first 3D region of interest, and responsive to a measurement selection user input action, a new 3D image is displayed. The new 3D image can include the second plurality of 3D graphical indicators and a new representation of the surface of the object that excludes the 3D surface points that are outside the second 3D region of interest.

In some implementations, a reference surface can be generated in the 3D representation in the second visual representation 204. The reference surface can be used as a reference relative to which positions on the target surface can be measured or identified. The reference surface can be generated by receiving a user input indicative of selection of three locations of the target surface and generating a reference surface that includes the selected three selected locations. In some implementations, the generated reference surface (e.g., edges/vertices/markers of the reference surface) can be superimposed on the 3D representation in the second visual representation 204. Additionally or alternately, portions of the target surface that lie on or adjacent to the reference surface (e.g., within a predetermined distance from the reference plane) can be visually indicated (e.g., by color-coding these portions of the target surface with a predetermined color) in the 3D representation. In some implementations, a graphical object (e.g., a line) can be rendered in the 3D representation which can be indicative of a location (e.g., a predetermined target position) on the target surface (e.g., location 222) relative to the reference plane.

In some implementations, a secondary 3D representation can be displayed concurrently with the first 3D representation in the second visual representation 204. The secondary 3D representation can include a secondary representation of the target surface generated from the 3D surface points at a magnification that differs from that of the first 3D representation. The first 3D representation and the secondary 3D representation can be rendered from similar 3D perspectives, and the first 3D cursor point can be displayed in the secondary 3D representation. In some implementations, the user input at step 106 can occur within the secondary 3D representation, and the second pixel location on the GUI can be offset from the first pixel location on the GUI. The direction of the offset can be derived from the position of the first user input action on the secondary 3D image. In some implementations, the first representation of the target surface comprises colors that differ from those in the 2D image and the secondary representation of the surface of the object comprises colors from the 2D image.

Figure 7:
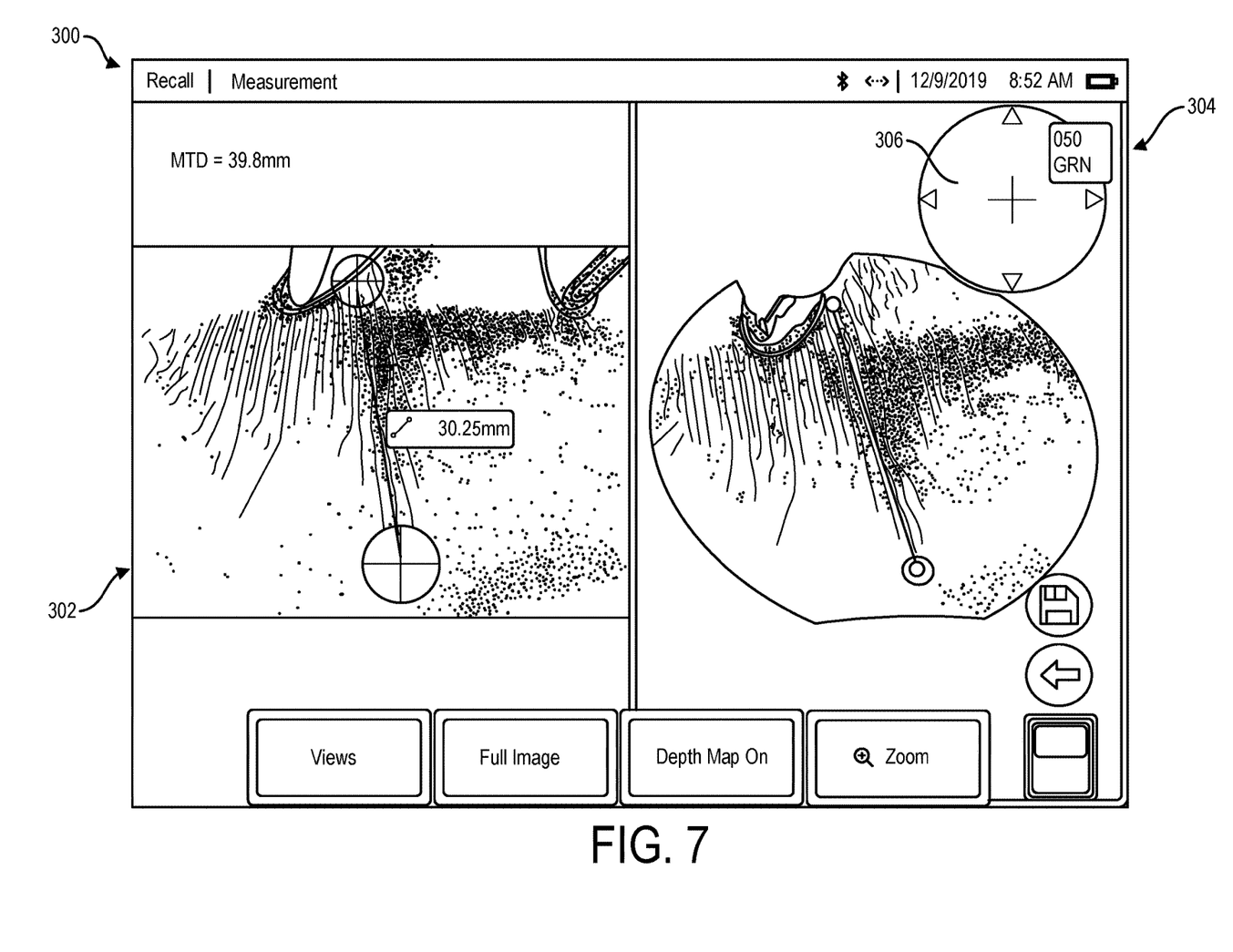
FIG. 7 illustrates an exemplary GUI that includes a zoom window.

In some implementations, the GUI can include a zoom window that can expand a portion of the 3D representation and/or 2D image in the GUI. FIG. 7 illustrates an exemplary GUI 300 that includes a first visual representation 302 including a 2D image and a second visual representation 304 including a 3D representation of the 2D image in the first visual representation 302. The second visual representation 304 includes a zoom window 306 that can provide an expanded view of a portion of the 3D representation. For example, the zoom window 306 can expand a portion of the 3D representation located in the vicinity of a cursor over the 3D representation. As the cursor moves to a new position, the zoom window displays the portions of the 3D presentation surrounding the new position of the cursor. In some implementations, the zoom window 306 does not include any graphical objects and provides an unimpeded view of the target surface (or a portion thereof). If the orientation of the 3D representation is changed, the zoom window 306 displays the target surface (or a portion thereof) from the vantage point of the cursor relative to the 3D representation in the new orientation. The zoom window 306 may display the same portion of the 3D representation at the same regardless of the magnification of the second visual representation 304.

In some implementations, both the first visual representation 202 and the second visual representation 204 can include 3D representations of different portions of the target surface. This can allow a user to simultaneously access the three dimensional point cloud view of the different portions of the target surface. In some implementations, the GUI 200 can include a third visual representation (not shown) that can include a third 3D representations of a third portion of the target surface. The various 3D representations can be presented from different perspectives. The third visual representation with the third 3D representations of the target surface can be generated based on receipt of one or more user inputs. For example, the one or more user inputs can include user input received at step 106 in FIG. 1 (e.g., based on movement of a finger or stylus in contact with a touch sensitive panel) and/or a second user input which can include breaking contact between the finger or stylus and the touch sensitive panel. In some implementations, the first user input can be based on movement of a mouse or track ball while pressing a button on the mouse or track ball and the second user input can be based on releasing the button on the mouse or track ball. In some implementations, the appearance of a graphical object changes upon transitioning between the first input mode and the second user input mode. For example, the first graphical object in the first input mode can include a first group of triangles combined to approximate the shape of a toroid and the corresponding graphical object in the second input mode can include a change in the size, color, visibility, or shape of the approximated toroid.

In one implementation, a user can provide a zoom control input (e.g., at step 106) to vary the magnification of the 3D representation (e.g., in the second visual representation 204). The magnification can change the initial 3D representation by a first scale factor. The size of a graphical object before and after magnification can differ by a second scale factor. The first and the second scale factor can be different and the second scale factor may not be equal to one. For example, if the 3D representation is magnified by a scale factor of 2.0, the size of a 3D graphical object might be increased by a scale factor of 1.4. This may provide a preferred user experience versus keeping the graphical object at a constant size or increasing the size of the graphical object by the same scale factor as the 3D representation.

FIGS. 2-7 illustrate GUIs that include both two-dimensional and three-dimensional representation of a portion of the target surface. In some implementations (not shown), a GUI may only include the three-dimensional representation of a portion of the target surface. As described above, the user perform various interactions with the three-dimensional representation (e.g., select multiple positions on the target surface, provide expanded view of a portion of the 3D representation using the zoom window, simultaneously access 3D point cloud view of different portions of the target surface, etc.).

The entire contents of U.S. Pat. No. 7,170,677 titled "Stereo-measurement borescope with 3-D viewing," and U.S. Pat. No. 7,821,649 titled "Fringe projection system and method for a probe suitable for phase-shift analysis" are hereby expressly incorporated by reference herein.

Other embodiments are within the scope and spirit of the disclosed subject matter. For example, the inspection system described in this application can be used in facilities that have complex machines with multiple operational parameters that need to be altered to change the performance of the machines (e.g., power generating turbines). Usage of the word "optimize"/"optimizing" in this application can imply "improve"/"improving."

Certain exemplary embodiments are described herein to provide an overall understanding of the principles of the structure, function, manufacture, and use of the systems, devices, and methods disclosed herein. One or more examples of these embodiments are illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a Read-Only Memory or a Random Access Memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball) or a touch screen, by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web interface through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

What is claimed is:

1. A method comprising:
   receiving data characterizing visual properties of a target surface extending in three dimensions, the visual properties of the target surface comprising color codes indicative of a state of an inspection target object comprising a portion of an industrial machine, the state of the inspection target object transitioning from a movable state to an active state or an inactive state;
   rendering, in a graphical user interface display space, a first visual representation comprising a two-dimensional image of a first portion of the target surface, and a second visual representation comprising a three-dimensional representation of at least a subset of the first portion of the target surface included in the first visual representation;
   receiving, based on a first user interaction with the inspection target object of the three-dimensional representation transitioned to the active state, a first user input indicative of a selection of a first location of the target surface;
   rendering a first graphical object at a first target position in the three-dimensional representation and a second graphical object at a second target position in the two-dimensional image, wherein the first target position and the second target position are indicative of the first location of the target surface and wherein the first target position is automatically adjusted to re-center the first graphical object in the three-dimensional representation to facilitate access to location selectors;
   receiving, based on a second user interaction with the three-dimensional representation, a second user input indicative of selection of two locations of the target surface using the location selectors; and
   rendering, in the graphical user interface, a first value indicative of a straight-line distance between the two locations.

2. The method of claim 1, wherein the second user interaction comprises:
   selecting a first position on the three-dimensional representation; and
   selecting a second position on the three-dimensional representation, wherein the first and the second positions are indicative of the two locations.

3. The method of claim 1, further comprising:
   receiving, based on a third user interaction with the three-dimensional representation, a third user input indicative of selection of a first location, a second location and a third location of the target surface; and
   indicating portions of the target surface rendered in the three-dimensional representation that are located on or adjacent to a reference plane determined based on the selected first, second, and third locations.

4. The method of claim 3, wherein the first, the second and the third locations are indicated by a first set of three graphical objects having a predetermined color in the two-dimensional image and a second set of three graphical objects having the predetermined color in the three-dimensional representation.

5. The method of claim 4, further comprising:
   rendering, in the three-dimensional representation, a third graphical object indicative of the reference plane; and
   rendering, in the three-dimensional representation, a fourth graphical object indicative of a straight-line distance between a target position on the three-dimensional representation and the reference plane.

6. The method of claim 1, further comprising:
   receiving, based on a fourth user interaction with the first graphical object, a fourth user input indicative of movement of the first graphical object along a first path in the three-dimensional representation; and
   rendering, in the two-dimensional image, movement of the second graphical object along a second path, wherein the second path is determined by identifying pixel coordinates in the two-dimensional image that are associated with surface points on the target surface traversed along the first path.

7. A system comprising:
   at least one data processor;
   memory coupled to the at least one data processor, the memory storing instructions to cause the at least one data processor to perform operations comprising:
      receiving data characterizing visual properties of a target surface extending in three dimensions, the visual properties of the target surface comprising color codes indicative of a state of an inspection target object comprising a portion of an industrial machine, the state of the inspection target object transitioning from a movable state to an active state or an inactive state;
      rendering, in a graphical user interface display space, a first visual representation comprising a two-dimensional image of a first portion of the target surface, and a second visual representation comprising a three-dimensional representation of at least a subset of the first portion of the target surface included in the first visual representation;
      receiving, based on a first user interaction with the inspection target object of the three-dimensional representation transitioned to the active state, a first user input indicative of a selection of a first location of the target surface;
      rendering a first graphical object at a first target position in the three-dimensional representation and a second graphical object at a second target position in the two-dimensional image, wherein the first target position and the second target position are indicative of the first location of the target surface and wherein the first target position is automatically adjusted to re-center the first graphical object in the three-dimensional representation to facilitate access to location selectors;
      receiving, based on a second user interaction with the three-dimensional representation, a second user input indicative of selection of two locations of the target surface using the location selectors; and
      rendering, in the graphical user interface, a first value indicative of a straight-line distance between the two locations.

8. The system of claim 7, wherein the second user interaction comprises:
   selecting a first position on the three-dimensional representation; and selecting a second position on the three-dimensional representation, wherein the first and the second positions are indicative of the two locations.

9. The system of claim 7, wherein the operations further comprising:
receiving, based on a third user interaction with the three-dimensional representation, a third user input indicative of selection of a first location, a second location and a third location of the target surface; and
indicating portions of the target surface rendered in the three-dimensional representation that are located on or adjacent to a reference plane determined based on the selected first, second, and third locations.

10. The system of claim 9, wherein the first, the second and the third locations are indicated by a first set of three graphical objects having a predetermined color in the two-dimensional image and a second set of three graphical objects having the predetermined color in the three-dimensional representation.

11. The system of claim 10, wherein the operations further comprising:
rendering, in the three-dimensional representation, a third graphical object indicative of the reference plane; and
rendering, in the three-dimensional representation, a fourth graphical object indicative of straight-line distance between a target position on the three-dimensional representation and the reference plane.

12. The system of claim 7, wherein the operations further comprising:
receiving, based on a fourth user interaction with the first graphical object, a fourth user input indicative of movement of the first graphical object along a first path in the three-dimensional representation; and
rendering, in the two-dimensional image, movement of the second graphical object along a second path, wherein the second path is determined by identifying pixel coordinates in the two-dimensional image that are associated with surface points on the target surface traversed along the first path.

13. A computer program product comprising a machine-readable, non-transitory, storage medium storing instructions that, when executed by at least one programmable processor, cause the at least one programmable processor to perform operations comprising:
receiving data characterizing visual properties of a target surface extending in three dimensions, the visual properties of the target surface comprising color codes indicative of a state of an inspection target object comprising a portion of an industrial machine, the state of the inspection target object transitioning from a movable state to an active state or an inactive state;
rendering, in a graphical user interface display space, a first visual representation comprising a two-dimensional image of a first portion of the target surface, and a second visual representation comprising a three-dimensional representation of at least a subset of the first portion of the target surface included in the first visual representation;
receiving, based on a first user interaction with the inspection target object of the three-dimensional representation transitioned to the active state, a first user input indicative of a selection of a first location of the target surface;
rendering a first graphical object at a first target position in the three-dimensional representation and a second graphical object at a second target position in the two-dimensional image, wherein the first target position and the second target position are indicative of the first location of the target surface and wherein the first target position is automatically adjusted to re-center the first graphical object in the three-dimensional representation to facilitate access to location selectors;
receiving, based on a second user interaction with the three-dimensional representation, a second user input indicative of selection of two locations of the target surface using the location selectors; and
rendering, in the graphical user interface, a first value indicative of a straight-line distance between the two locations.

14. The computer program product of claim 13, wherein the second user interaction comprises:
selecting a first position on the three-dimensional representation; and
selecting a second position on the three-dimensional representation, wherein the first and the second positions are indicative of the two locations.

15. The computer program product of claim 13, wherein the operations further comprising:
receiving, based on a third user interaction with the three-dimensional representation, a third user input indicative of selection of a first location, a second location and a third location of the target surface; and
indicating portions of the target surface rendered in the three-dimensional representation that are located on or adjacent to a reference plane determined based on the selected first, second, and third locations.

16. The computer program product of claim 15, wherein the first, the second and the third locations are indicated by a first set of three graphical objects having a predetermined color in the two-dimensional image and a second set of three graphical objects having the predetermined color in the three-dimensional representation.

17. The computer program product of claim 16, wherein the operations further comprising:
rendering, in the three-dimensional representation, a third graphical object indicative of the reference plane; and
rendering, in the three-dimensional representation, a fourth graphical object indicative of straight-line distance between a target position on the three-dimensional representation and the reference plane.

* * * * *